United States Patent [19]

Joshi et al.

[11] 4,123,300
[45] Oct. 31, 1978

[54] INTEGRATED CIRCUIT PROCESS UTILIZING LIFT-OFF TECHNIQUES

[75] Inventors: Madhukar L. Joshi; Paul F. Landler; Ronald Silverman, all of Essex Junction, Vt.

[73] Assignee: International Business Machines Corporation, Armonk, N.Y.

[21] Appl. No.: 793,217

[22] Filed: May 2, 1977

[51] Int. Cl.$^2$ .................... H01L 29/58; H01L 21/265
[52] U.S. Cl. .................................... 148/187; 148/1.5; 357/23; 357/41; 357/59
[58] Field of Search ............... 357/41, 59, 23; 29/571, 29/578, 579; 148/187, 1.5, 187

[56] References Cited

U.S. PATENT DOCUMENTS 4,055,885  11/1977  Takemoto ......................... 29/578

OTHER PUBLICATIONS

S.A. Abbas, "FET Integrated Circuit Having Two Polysilicon Layers," IBM-TDB, vol. 15 (1973) 3022.

*Primary Examiner*—L. Dewayne Rutledge
*Assistant Examiner*—Upendra Roy
*Attorney, Agent, or Firm*—Stephen J. Limanek

[57] ABSTRACT

A method for making high density integrated circuits which utilizes lift-off techniques provides a structure having a single layer of insulating material for both the dielectric of a storage capacitor and the insulator for a gate or control electrode of a switching element. The steps of the method include forming a thin layer of silicon dioxide on a silicon substrate followed by a layer of first doped polysilicon and, optionally, a layer of silicon nitride and then a layer of photoresist. The layers are etched to the silicon dioxide surface with the exception of the portion of the layers overlying a region defined as the gate or control electrode of the switching element. A second layer of doped polysilicon is then deposited over the remaining structure to provide on the silicon dioxide layer a second conductive layer adjacent to but spaced from the first polysilicon layer forming the gate or control electrode. The silicon nitride, when used, is etched away and a strip of conductive metal is placed in contact with the first conductive polysilicon layer after the second doped polysilicon layer has been appropriately oxidized to form an insulating medium over this second polysilicon layer and between the first and second polysilicon layers. Any desired $n+$ regions may be formed in the silicon substrate by diffusing impurities into the substrate prior to forming the silicon dioxide layer, or the $n+$ regions may be formed after the silicon dioxide has been formed by using appropriate ion implantation techniques. By employing this method, high density one device memory arrays may be produced by using the first doped polysilicon layer for forming the gate electrode of a field effect transistor and the second doped polysilicon layer as an electrode of the storage capacitor.

15 Claims, 16 Drawing Figures

INTEGRATED CIRCUIT PROCESS UTILIZING LIFT-OFF TECHNIQUES

BACKGROUND OF THE INVENTION

1. Field of the Invention

This invention relates to processes for making integrated circuits and more particularly to processes which employ lift-off techniques. More specifically, the invention relates to processes for making self-aligned memory cells which form a very high density memory array.

2. Description of the Prior Art

Integrated circuits, particularly those employing field effect transistors in a semiconductor substrate, have achieved very high densities of active and passive components. To achieve these high densities various techniques and processes have been developed to reduce the size of each circuit and to reduce the area required for isolation within the substrate between the circuits. Moreover, in order to further increase the densities in the integrated circuits, for example, in the memory technology, very simple circuits have been developed which utilize a very small amount of surface area on the semiconductor substrate. One of the simplest circuits for providing a memory cell is described in commonly owned U.S. Pat. No. 3,387,286, filed July 14, 1967, by R. H. Dennard. This cell employs a single field effect transistor as a switch for coupling a capacitor to a bit/sense line. In also commonly owned U.S. Pat. Nos. 3,811,076, by W. M. Smith, and 3,841,926, by R. H. Garnache and W. M. Smith, both filed Jan. 2, 1973, there is disclosed a one device field effect transistor memory cell of the type described in the above-identified Dennard patent which utilizes a layer of polycrystalline silicon as a field shield and as an electrode for a storage capacitor in order to improve cell density. To further improve the density of the cells described in U.S. Pat. Nos. 3,811,076 and 3,841,926, the process for making the cells utilizes a dual layer of silicon nitride and silicon dioxide and a polysilicon conductive layer.

In U.S. Pat. Nos. 3,771,147, filed Dec. 4, 1972, there is disclosed a one device field effect transistor memory cell wherein a first level metal, tungsten, is used to provide a self-aligned gate and a metallic layer held at a reference potential serves as an electrode for the storage capacitor.

In U.S. Pat. No. 3,648,125, filed Feb. 2, 1971, there is disclosed a process for making integrated circuits which includes forming electrically isolated pockets by a grid of oxidized silicon extending into silicon material, and in the periodical, *Electronics*, Sept. 11, 1972, page 31, there is a suggestion that the use of oxide isolation techniques be employed for making single transistor memory cells.

Electrical isolation techniques wherein a polysilicon grid is used to produce islands of single crystal silicon is disclosed in U.S. Pat. No. 3,736,193, filed July 29, 1969.

Field effect transistors having silicon gates with a nitride-oxide gate dielectric are suggested in U.S. Pat. No. 3,699,646, filed Dec. 28, 1970, and in the periodical, *Electronics*, dated Aug. 2, 1971, on page 74.

In *IBM Technical Disclosure Bulletin*, Vol. 18, No. 1, June 1975, pages 68 and 69, there is described a memory array having a high word line packing density by employing spaced polysilicon lines which are oxidized with aluminum strips disposed between and insulated from the polysilicon lines.

Commonly assigned U.S. Pat. No. 3,849,136, filed on July 31, 1973, by K. R. Grebe, describes a lift-off process employing a photoresist for depositing in a controlled manner a thin film on a substrate.

In commonly assigned application Ser. No. 617,462 filed on Sept. 29, 1975, by A. Furman, H. L. Kalter and J. W. Nagel, now U.S. Pat. No. 4,021,789 there is disclosed a high density memory array employing a nitride-oxide gate dielectric and two layers of doped polycrystalline silicon separated only by a layer of oxide.

In *IBM Technical Disclosure Bulletin*, Vol. 18, No. 6, November 1975, pages 1766 and 1767, there is described an integrated circuit fabrication process utilizing a photoresist lift-off technique for forming a polysilicon layer and a platinum layer on an insulating layer of silicon dioxide wherein the platinum layer serves as the gate electrode for a field effect transistor.

By employing the techniques disclosed in the above indentified patents and articles, the semiconductor industry has produced integrated semiconductor circuits which contain thousands of cells on small semiconductor substrates or chips, which are generally made of silicon.

SUMMARY OF THE INVENTION

It is an object of this invention to provide an improved process for making integrated circuits which further increase the component density and reliability in semiconductor chips.

It is another object of this invention to provide a very high density of memory cells on a semiconductor chip by forming the elements of the cells with improved self-aligning techniques.

Yet another object of this invention is to provide integrated circuits formed in a relatively planar integrated circuit structure.

A further object of this invention is to provide a semiconductor integrated circuit memory cell employing only a single insulating layer, such as silicon dioxide, at the gate or control electrode of the switching element to minimize or eliminate charge storage in the insulating layer of the gate or control electrode.

Still another object of this invention is to provide a memory cell employing a polysilicon lift-off process using a photoresist as the lift-off divider producing adjacent conductive polysilicon films on a common plane separated by a thin insulating medium.

Yet a further object of this invention is to provide an improved process for making in a semiconductor substrate an array of high density memory cells comprising field effect transistors having elements and an associated capacitor which are self-aligned and wherein the cells are electrically isolated from each other within the substrate.

Still a further object of this invention is to provide a process for making an improved memory array employing a high density of cells each having a single field effect transistor and a storage capacitor which utilizes minimal mask steps.

In accordance with the teachings of this invention, a method is provided for making high density integrated circuits, such as memory cells, in a semiconductor substrate, preferably made of silicon, which includes formation of a single layer of a thin dielectric medium onto the substrate, followed by the deposition of a first layer of conductive polycrystalline silicon, or polysilicon, and optionally a layer of silicon nitride, if a self-aligned contact is desired, and a layer of photoresist. A mask is then used to define gate or control electrode regions in the first layer of polysilicon and the layers of material outside the gate regions are etched away partially or entirely down to the dielectric layer. A second layer of conductive polycrystalline silicon is then deposited and the portion of the second layer disposed on the photoresist is lifted off along with the photoresist. The second layer of polysilicon is oxidized along with the edges of the first layer of polysilicon. By a known dip etch process the silicon nitride is removed from over the first layer of polysilicon, or if no nitride is present a conventional contact hole is formed, and a conductive metallic layer is deposited in contact with the first layer of polysilicon. Source and drain regions for field effect transistors or charge sources may be formed in the silicon substrate by diffusing impurities into the substrate prior to forming the dielectric layer or by ion implantation after the dielectric layer has been formed.

By utilizing the teachings of this invention, various types of dynamic memories utilizing storage capacitors can be made having a very high density of cells.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
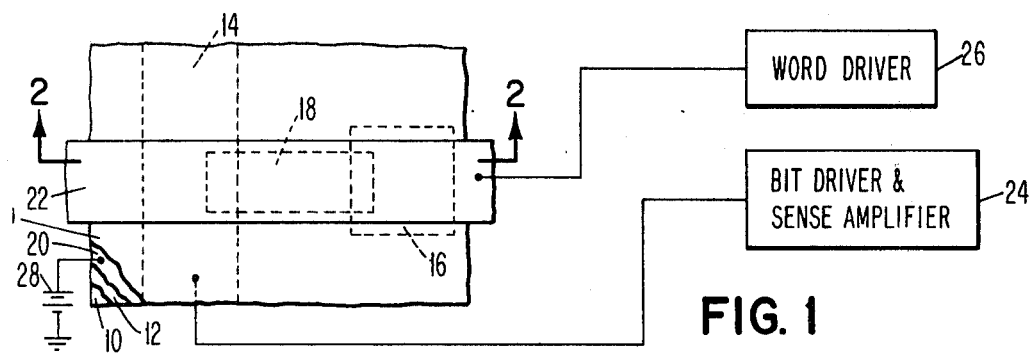
FIG. 1 is a plan view illustrating a memory cell made by the process of the present invention.

Referring to the drawing in more detail, particularly to FIG. 1, there is shown a substrate 10 preferably made of P-type silicon on which is deposited a thin layer of dielectric material, preferably silicon dioxide 12, having a thickness of approximately 450 Angstroms. Under the silicon dioxide layer 12 and formed by an appropriate n+ diffusion within the substrate 10 is a bit/sense line 14 and also a storage node 16. Disposed on the silicon dioxide layer 12 is a gate electrode 18 made of a first layer of doped polycrystalline silicon or polysilicon. Surrounding the polysilicon gate electrode 18 is a second layer of doped polycrystalline silicon 20 disposed over substantially the entire substrate 10 with the exception of the region surrounding the gate electrode 18. A word line 22 which may be made of copper doped aluminum is disposed over and in contact with the gate electrode 18 while being insulated from the second layer of polysilicon 20 by an insulation layer 30. A bit driver and sense amplifier 24 is coupled to the bit sense line 14 and a word driver 26 is coupled to the word line 22. A source of reference potential 28 is connected to the second layer of polysilicon 20.

The memory cell illustrated in FIG. 1 operates in a well known manner by writing information into a storage capacitor defined by storage node 26 with signals from the bit driver 24 when the word driver 26 has applied a pulse to the gate electrode 18 through a word line 22, and information is read out of the storage capacitor by applying a pulse from the word driver 26 to the word line 22 and sensing the output signal at the sense amplifier 24.

Figure 2A:
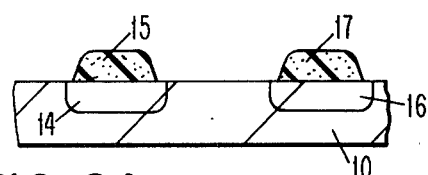
FIGS. 2A through 2G are sectional views taken through 2—2 of FIG. 1 as the cell is being made in accordance with the teachings of one embodiment of this invention.
Figure 2B:
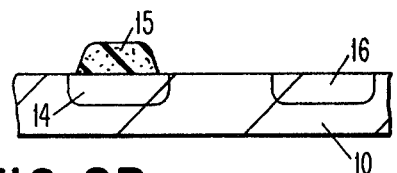
Figure 2C:
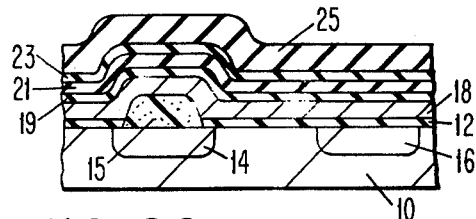
Figure 2D:
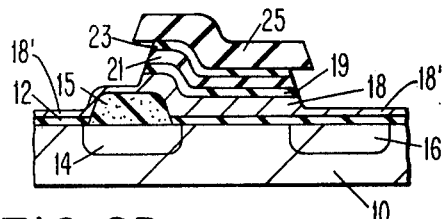
Figure 2E:
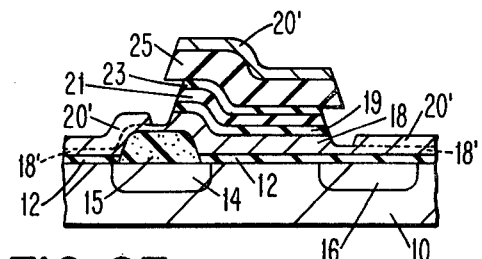
Figure 2F:
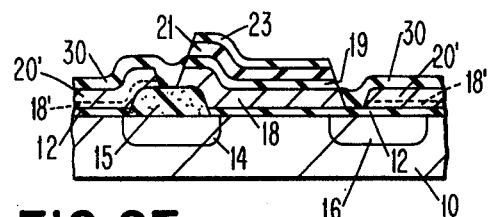
Figure 2G:
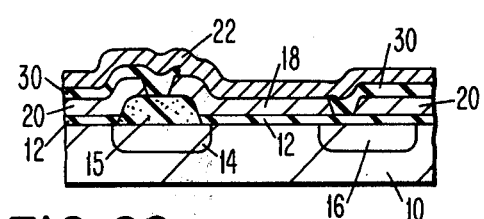

In accordance with this invention, the process for making the memory cell illustrated in FIG. 1 is indicated in FIGS. 2A through 2G. N+ diffusions for the bit/sense line 14 and the storage node 16 are provided by doped oxide strip 15 and rectangular film of doped oxide 17, respectively. The strip 15 and film 17 may be produced by forming a layer of doped oxide on the surface of the substrate 10 and then utilizing an appropriate masking technique to define the desired geometries, as indicated in FIG. 2A of the drawing. The dopant from the strip 15 and film 17 is driven into the substrate 10 in a known manner to form the diffused bit/sense line 14 and storage node 16. The rectangular film 17 is then etched away while the doped oxide 15 is protected by an appropriate mask and preserved on the substrate 10, as shown in FIG. 2B. The thin silicon dioxide layer 12 is formed on the surface of the substrate 10 by any well known techniques such as thermal oxidation. The first layer of polysilicon 18 is deposited on the silicon dioxide layer 12. Polysilicon layer 18 may be deposited by decomposition of silane in the presence of a boron containing gas, such as Diborane, at a temperature of about 900° C. A very thin second layer of silicon dioxide 19 which is preferably only about 100 Angstroms thick is formed over the first layer of polysilicon 18, e.g., by thermal oxidation. A layer of silicon nitride 21 is deposited over the second layer of silicon dioxide 19 and a third layer of silicon dioxide 23 is deposited over the silicon nitride layer 21 as shown in FIG. 2C, e.g. by pyrolytic deposition techniques. Over the third layer of silicon dioxide 23 is deposited a layer of photoresist 25, preferably negative photoresist, as illustrated in FIG. 2C. By appropriate masking in order to define a gate region, each of the layers 18, 19, 21, 23 and 25 are etched away with the exception of that portion of each of these layers disposed between the storage node 16 and the bit/sense line 14, as indicated in FIG. 2D of the drawing. If desired, layer 18 may be etched away only partially to form a relatively thin portion 18' over the thin oxide 12 outside of the gate region. A suitable etchant for the polycrystalline silicon 18 is hydrofluoric acid and nitric acid in water or hydrofluoric acid, nitric acid and acetic acid in admixture. The second layer of polysilicon 20' is now disposed or evaporated over the photoresist 25 and oxide layer 12, as well as over a portion of the doped oxide strip 15. The thickness of this second layer of polysilicon 20' plus the thickness of the thin portion of polysilicon 18' is, preferably, equal to the thickness of the first layer of polysilicon 18. That portion of the second layer of polysilicon 20' which is disposed over the photoresist 25, as shown in FIG. 2E, is lifted off by dissolving the photoresist under this portion in a suitable solvent, e.g., butyl acetate or N methyl pyrrolidinone. The exposed surfaces of the polysilicon of the second layer 20' are then oxidized along with the oxidation of the edges or sides of the first polysilicon layers 18 and 18' to form an insulating layer 30 and the second polysilicon layer 20 as indicated in FIGS. 2F and 2G of the drawing. If desired, first polysilicon layer 18 could have been etched through entirely without leaving the thin portion 18'. In this instance layer 20 would have been formed in its entirety after the formation of layer 18 with a thickness, preferably, equal to the thickness of layer 18. The silicon nitride layer 21, along with the two thin silicon dioxide layers 19 and 23, are then removed by any known unmasked dip etch process so as to expose the upper surface of the first layer of polysilicon 18 between bit/sense line 14 and the storage node 16. This dip etch process may use hydrofluoric acid which etches away all of the exposed nitride-oxide insulation 19, 21, 23 above the first polysilicon layer 18, but due to the thickness of the insulating layer 30 only an insignificant portion of it is etched away. To complete the process for making the cell, the word line 22, e.g., made of copper-doped aluminum, is deposited in contact with the first layer of polysilicon 18 while being separated from the second layer of polysilicon 20 by the insulating layer 30, as shown in FIG. 2G.

As can be seen, the process of this invention described hereinabove in connection with FIGS. 2A through 2G provides a cell somewhat similar to that described in the above-identified U.S. Pat. No. 3,811,076 but differs therefrom in that only a single layer of insulation 12 is required beneath the first layer of polysilicon 18 which forms the gate electrode of the transistor having source and drain formed by the diffusions at 16 and 14, respectively. Furthermore, the storage capacitor has only a single dielectric layer 12 which has its electrodes formed by the second layer of polysilicon 20 and the storage node 16. By eliminating the nitride, particularly in the gate region under the first layer of polysilicon, charge accumulations in the dielectric between the electrode 18 and the substrate 10 are unlikely to occur as they are when dual dielectrics are employed, such as when the combination of silicon dioxide and silicon nitride is employed. Furthermore, it should be noted that the process of the present invention provides gate and storage electrodes 18 and 20, respectively, in close proximity to each other without the need for critical alignment between these two conductors.

It should also be understood that appropriate electrical contacts are made at remote points from the memory cell to the polysilicon layers 18 and 20, to the diffusions 14 and 16 and to the substrate 10, as required. Furthermore, it should be noted that the word line 22 is produced by evaporating the copper-doped aluminum over the entire surface of the structure indicated in FIG. 2G and then appropriate lines are formed by using known masking techniques.

Figure 3A:
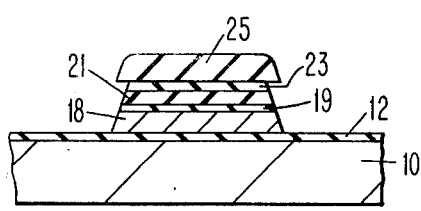
FIGS. 3A through 3D are sectional views similar to those of FIGS. 2A through 2G as the cell of FIG. 1 is being made in accordance with the teachings of a second embodiment of this invention.
Figure 3C:
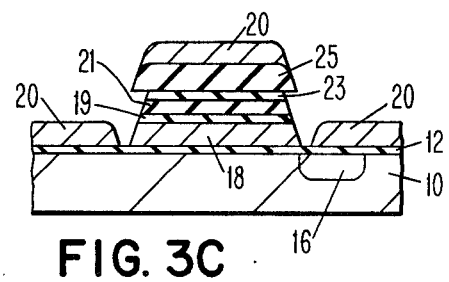
Figure 3B:
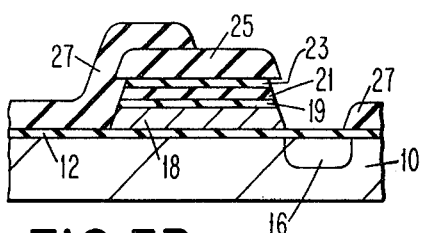
Figure 3D:
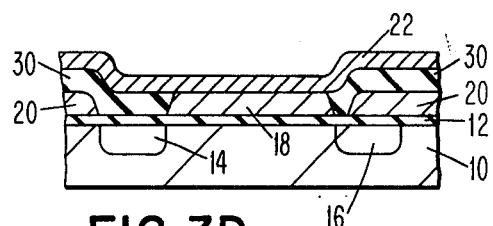

A memory cell similar to the cell illustrated in FIG. 1 of the drawing may be made by employing a second embodiment of the invention which is illustrated in FIGS. 3A through 3D of the drawings. In this embodiment of the invention, the thin dielectric layer 12 is formed on the silicon substrate 10 prior to the formation of the bit/sense line 14 and the storage node 16 in the substrate 10. As shown in FIG. 3A, the first layer of polysilicon 18 is deposited on the thin dielectric layer 12 and then there are deposited the subsequent layers including second silicon dioxide layer 19, the silicon nitride layer 21, the third silicon dioxide layer 23 and the photoresist 25. By suitable masking techniques, the layers are etched away to provide a gate electrode 18, as indicated in FIG. 3A. The storage node 16 is defined by a layer of positive photoresist 27 and the negative photoresist 25, with well known ion implanting techniques introducing an $n+$ ion into substrate 20 through the silicon dioxide 12. The positive photoresist 27 is then removed and the second layer of polysilicon 20 is deposited over the negative photoresist 25 and the silicon dioxide 12. To form the bit/sense line 14, as indicated in FIG. 3D, a portion of the second layer of polysilicon 20 is etched away by employing suitable etching and masking techniques and ion implant techniques are again employed to introduce $n+$ ions into the substrate 10. The exposed surface of the second layer of polysilicon 20 is oxidized, along with the sides or edges of the first layer of polysilicon 18 to form an insulating layer 30. The second and third silicon dioxide layers 19 and 23 along with the silicon nitride 21, as well as the remaining portion of negative photoresist 25 and the polysilicon 20 supported thereon, as indicated in FIG. 3C, are etched away to expose the upper surface of the first layer of polysilicon 18. Word line 22 is then formed over and in contact with the first layer of polysilicon 18 and insulated from the second layer of polysilicon 20 by insulating layer 30.

It can be seen that the technique employed in this invention again provides a self-alignment between the first layer of polysilicon 18 which forms a gate electrode and the second layer of polysilicon 20 which forms an electrode of the storage capacitor above storage node 16, as well as a field shield for the memory, with a well defined close spacing between the two insulated conductive layers 18 and 20.

Figure 4:
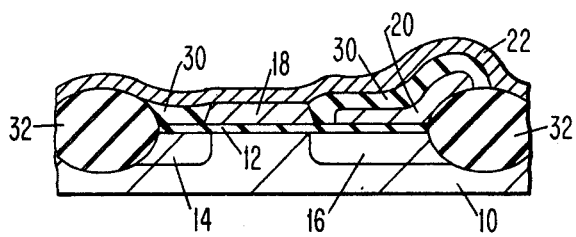
FIG. 4 is a sectional view of a cell similar to that of FIG. 2G and of FIG. 3D made in accordance with the teachings of a third embodiment of the present invention.

Although the embodiments of the process of the invention taught in connection with FIGS. 2A through 2G and FIGS. 3A through 3D provide a field shield 20 for isolating the memory cells from each other, it should also be known that the invention may be used in connection with the well known recessed oxide techniques for isolating circuits from each other. It can be seen in FIG. 4 that a recessed oxide 32 may be formed within substrate 10, by using, e.g., a silicon nitride mask, prior to depositing the first layer of polysilicon 18 on the thin silicon dioxide layer 12. After the layers of silicon dioxide 19, silicon nitride 21, silicon dioxide 23 and the photoresist 25, as indicated in FIG. 3A, are formed over the first layer of polysilicon 18, the bit/sense line 14 and the storage node 16 may be formed by ion implantation techniques, as indicated hereinabove.

Figure 5:
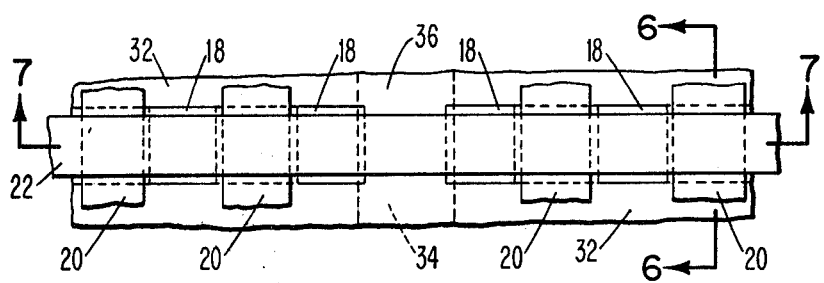
FIG. 5 is a plan view of yet another memory which is made in accordance with the teachings of a fourth embodiment of this invention.
Figure 6:
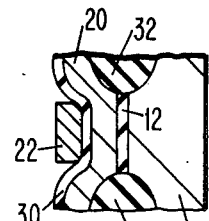
FIGS. 6 and 7 are sectional views of the memory illustrated in FIG. 5 taken along lines 6—6 and 7—7, respectively.
Figure 7:
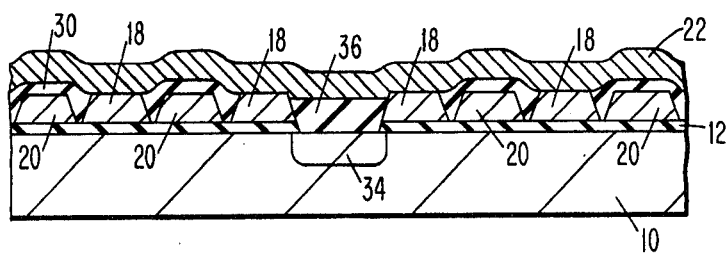

Although the embodiments of this invention have all been described in connection with the making of a one device memory cell employing a field effect transistor and a storage capacitor, it should also be known that the process of the present invention may be employed in the making of other memory circuits, e.g., as illustrated in FIGS. 5, 6 and 7 of the drawing. The memory indicated in FIGS. 5, 6 and 7 of the drawing is basically a charge puddle memory of the type described in commonly assigned U.S. patent application Ser. No. 672,197, entitled, "Capacitor Storage Memory", filed by W. D. Pricer on Mar. 31, 1976 now U.S. Pat. No. 4,080,590. As illustrated in FIGS. 5, 6 and 7 of the drawing, the charge puddle memory includes a silicon substrate 10 having a charge source 34 formed by an appropriate diffusion therein. A thin layer of silicon dioxide 12 is formed on the surface of the substrate 10. In this memory, first and second layers of polysilicon 18 and 20, respectively, are provided in a manner similar to that described hereinabove in connection with the one device memory cells. A plurality of spaced apart strips of the second layer of polysilicon 20 are arranged parallel to the charge source 34 with segments of the first layer of polysilicon 18 being provided to couple the charge souce 34 to each of the strips of polysilicon 20. The strips of polysilicon 20 form the bit/sense lines for the memory, as well as electrodes for the storage capacitors. The segments of the first layer of polysilicon 18 are connected to a word line 22 and form gate or control electrodes for the memory. A thick layer of silicon dioxide 36 is interposed between the charge source 34 and the word line 22, as can be seen more clearly in FIG. 7 of the drawing.

When making the charge puddle memory, illustrated in FIGS. 5, 6 and 7, in accordance with the teachings of the process of the present invention, strips of recessed oxide 32 are formed so as to be arranged perpendicularly to the direction of the charge source 34 on both sides of word line 22 and extend from the charge source 34 in opposite directions. A thin layer of silicon dioxide 12 is disposed on the surface of the substrate 10 and the first layer of polysilicon 18 and the silicon nitride 21, not illustrated in FIGS. 5, 6 and 7, are formed thereover in the same manner as discussed hereinabove in connection with the fabrication of the one device memory cells. The first layer of polysilicon 18 and the nitride 21 are etched to form strips extending in a direction perpendicular to the charge source 34 and disposed between the recessed oxide strips 32. The recessed oxide strips 32 are formed after the first layer of polysilicon strips 18 and the silicon nitride strips 21 have been formed. After the recessed oxide strips 32 have been formed, appropriate masking and diffusion techniques are employed to produce $n+$ diffusions into the substrate 10 to form the charge source 34. A photoresist layer is then applied over the nitride and the charge source 34 which has been protected by the thick oxide 36. The usual masking techniques are then employed to etch away strips of the resist, the silicon nitride and the first layer of polysilicon to the surface of the thin dielectric layer 12 defining the segments of the first layer of polysilicon 18 as illustrated more clearly in FIG. 5 of the drawing. The second layer of polysilicon 20 is then deposited over the remaining photoresist and onto the exposed sections of the thin silicon dioxide 12. The lift-off technique is then employed to remove the second layer of polysilicon 20 over the photoresist. The exposed surface of the second layer of polysilicon 20 is oxidized along with the edges of the first layer of polysilicon 18 to form the insulating layer 30 and the silicon nitride remaining on the first layer of polysilicon 18 is removed by the dip etch process. A metallic layer, preferably copper-doped aluminum, is then evaporated onto and in contact with the first layer of polysilicon 18 and etched to provide the word lines 22.

By using the process of the present invention, a charge puddle memory is provided which has very high density and requires a minimal number of masking steps.

The process of this invention may be used to fabricate structures other than those illustrated herein. For example, the electrodes for establishing depletion wells in charge coupled devices may be formed by utilizing the teachings of this invention. The structure and operation of charge coupled devices is disclosed, e.g., in commonly owned U.S. Pat. No. 3,819,959 filed by J. J. Chang and J. W. Sumilas.

It should be noted that even though the illustrated structures formed in accordance with this invention are relatively planar, a more planar structure can be produced by making the thickness of the first polysilicon layer 18 greater than the thickness of the second polysilicon layer 20, e.g., by making the thickness of the first polysilicon layer 18 equal to the sum of the thicknesses of the second polysilicon layer 20 and the insulating layer 30.

It should also be noted that the doped polysilicon layers 18 and 20 may be replaced by a refractory metal, such as tantalum with anodic tantalum oxide forming the insulation barrier at the surface of the tantalum. Other materials which are thermally, chemically or anodically self-insulatable in an unmasked batch process step may also be used.

Accordingly, it can be seen that by utilizing the teachings of this invention, relatively planar, high density, reliable integrated circuits and particularly memory cells are produced by a relatively simple process without the use of a dual dielectric as the gate insulator.

While the invention has been particularly shown and described with reference to preferred embodiments thereof, it will be understood by those skilled in the art that various changes in form and details may be made therein without departing from the spirit and scope of the invention.

What is claimed is:

1. A method of making an integrated circuit in a semiconductor comprising the steps of
   forming a dielectric layer on the semiconductor surface;
   depositing a first layer of polycrystalline silicon on said dielectric layer;
   superimposing on said silicon layer a patterned layer of photoresist defining within the edges of said patterned layer of photoresist a protected region of said first layer of polycrystalline silicon;
   removing that portion of said first polycrystalline silicon layer without said protected region;
   depositing a second layer of polycrystalline silicon over said dielectric layer without the edges of said patterned layer of photoresist and over said patterned photoresist layer;
   removing said patterned photoresist layer and that portion of said second layer of polycrystalline silicon deposited over said patterned photoresist layer; and
   oxidizing the surfaces of the remaining portions of said first and second polycrystalline silicon layers to form insulated polycrystalline silicon segments in proximity to each other on said dielectric layer.

2. A method of making an integrated circuit in a semiconductor as set forth in claim 1 wherein said portion of said first layer of polycrystalline silicon without said protected region is removed by an etching process.

3. A method of making an integrated circuit in a semiconductor as set forth in claim 1 wherein said semiconductor has a given conductivity and further comprising the step of introducing an impurity into said semiconductor so as to provide a first region adjacent said protected region having a conductivity opposite to that of said given conductivity.

4. A method of making an integrated circuit in a semiconductor as set forth in claim 1 further including the step of interposing a layer of silicon nitride between said first layer of polycrystalline silicon and said patterned photoresist layer.

5. A method of making an integrated circuit in a semiconductor as set forth in claim 2 wherein said portion of said first polycrystalline layer without said protected region is removed in its entirety.

6. A method of making an integrated circuit in a semiconductor as set forth in claim 1 wherein said portion of said first polycrystalline layer without said protected region is removed partially so as to form a region of said first polycrystalline silicon layer thinner than that of said protected region.

7. A method of making an integrated circuit in a semiconductor as set forth in claim 3 further comprising the step of introducing said impurity into said semiconductor so as to provide first and second regions on opposite sides of said protected region having a conductivity opposite to that of said given conductivity.

8. A method of making an integrated circuit in a semiconductor as set forth in claim 4 further including the steps of interposing first and second silicon dioxide layers between said first layer of polycrystalline silicon and said patterned photoresist layer, said first silicon dioxide layer being disposed between said first layer of polycrystalline silicon and said silicon nitride layer and said second silicon dioxide layer being disposed between said silicon nitride layer and said patterned photoresist layer.

9. A method of making an integrated circuit in a semiconductor as set forth in claim 4 further including the step of removing said layer of silicon nitride to expose a surface of said first polycrystalline silicon layer.

10. A method of making an integrated circuit in a semiconductor as set forth in claim 7 wherein one of said first and second regions is defined by said patterned photoresist layer and a second photoresist layer, one of said photoresist layers being a positive photoresist and the other of said photoresist layers being a negative photoresist.

11. A method of making an integrated circuit in a semiconductor as set forth in claim 7 further including forming an insulator over one of said first and second regions to a thickness substantially greater than that of said dielectric layer.

12. A method of making an integrated circuit in a semiconductor as set forth in claim 9 wherein said silicon nitride layer is removed by an unmasked dip etch process.

13. A method of making an integrated circuit on a substrate comprising the steps of:
depositing a first layer of polycrystalline silicon on said substrate;
superimposing on said silicon layer a patterned layer of photoresist defining within the edges of said patterned layer of photoresist a protected region of said first layer of polycrystalline silicon;
removing a portion of said first polycrystalline silicon layer without said protected region;
depositing a second layer of polycrystalline silicon over said substrate without the edges of said patterned layer of photoresist and over said patterned photoresist layer;
removing said patterned photoresist layer and that portion of said second layer of polycrystalline silicon deposited over said patterned photoresist layer; and
oxidizing the surfaces of the remaining portions of said first and second polycrystalline silicon layers to form polycrystalline silicon segments on said substrate insulated from each other without one of said silicon layers overlapping the other.

14. A method of making a memory circuit in a semiconductor comprising the steps of
forming source and drain electrodes in said semiconductor;
forming a dielectric layer on said semiconductor;
depositing a first layer of doped polycrystalline silicon on said dielectric layer;
depositing a layer of silicon nitride on said first layer of polycrystalline silicon;
forming on said silicon nitride layer a patterned layer of photoresist defining within the edges of said patterned layer of photoresist a gate region between said source and drain electrodes;
removing portions of said silicon nitride layer and said first layer of doped polycrystalline silicon without said gate region;
depositing a second layer of doped polycrystalline silicon over said dielectric layer without the edges of said patterned layer of photoresist and over said patterned layer of photoresist;
removing said patterned photoresist layer and that portion of said second layer of polycrystalline silicon deposited over said patterned photoresist layer;
oxidizing portions of said first and second polycrystalline silicon layers to form polycrystalline silicon segments insulated from each other;
removing the remaining portion of said layer of silicon nitride to expose a surface of said first polycrystalline silicon layer; and
depositing a conductive line over said first and second polycrystalline silicon layers in electrical contact with said exposed surface of said first polycrystalline silicon layer.

15. A method of making a memory circuit as set forth in claim 14 further comprising the step of forming an insulator over one of said source and drain electrodes to a thickness substantially greater than that of said dielectric layer.

* * * * *

UNITED STATES PATENT OFFICE
CERTIFICATE OF CORRECTION

PATENT NO. : 4,123,300
DATED : October 31, 1978
INVENTOR(S) : M. L. JOSHI ET AL

It is certified that error appears in the above-identified patent and that said Letters Patent are hereby corrected as shown below:

Col. 9, line 8

Delete "1" and insert --2--.

Col. 10, line 42 insert --exposed-- after "oxidizing".

Signed and Sealed this

Eighteenth Day of December 1979

[SEAL]

Attest:

SIDNEY A. DIAMOND

Attesting Officer　　Commissioner of Patents and Trademarks